United States Patent
Dakshina-Murthy et al.

(10) Patent No.: US 7,144,785 B2
(45) Date of Patent: Dec. 5, 2006

(54) METHOD OF FORMING ISOLATION TRENCH WITH SPACER FORMATION

(75) Inventors: Srikanteswara Dakshina-Murthy, Wappingers Falls, NY (US); Douglas Bonser, Hopewell Junction, NY (US); Mark C. Kelling, Marlboro, NY (US); Asuka Nomura, Poughkeepsie, NY (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/976,869

(22) Filed: Nov. 1, 2004

(65) Prior Publication Data

US 2006/0094205 A1 May 4, 2006

(51) Int. Cl.
*H01L 21/336* (2006.01)
(52) U.S. Cl. .............. 438/297; 438/700; 438/439; 257/E21; 257/552; 257/559
(58) Field of Classification Search ........... 438/297, 438/294, 296, 439, 197, 311, 692, 700, 933, 438/752, 753, 755, 733, 734, 743, 744, 745
See application file for complete search history.

(56) References Cited

U.S. PATENT DOCUMENTS

| | | | |
|---|---|---|---|
| 6,853,032 B1 * | 2/2005 | Ballantine et al. | 257/337 |
| 6,858,532 B1 * | 2/2005 | Natzle et al. | 438/637 |
| 6,998,684 B1 * | 2/2006 | Anderson et al. | 257/351 |
| 2003/0049893 A1 | 3/2003 | Currie et al. | |
| 2004/0164373 A1 | 8/2004 | Koester et al. | |
| 2004/0180509 A1 | 9/2004 | Wang et al. | |
| 2005/0101077 A1 | 5/2005 | Lee et al. | |
| 2005/0277271 A1 * | 12/2005 | Beintner et al. | 438/478 |

FOREIGN PATENT DOCUMENTS

EP  0 562 671 A  7/1993

* cited by examiner

Primary Examiner—David Nhu (57) ABSTRACT

A strained silicon semiconductor arrangement with a shallow trench isolation (STI) structure has a strained silicon (Si) layer formed on a silicon germanium (SiGe) layer. A trench extends through the Si layer into the SiGe layer, and sidewall spacers are employed that cover the entirety of the sidewalls within the trench in the SiGe layer. Following STI fill, polish and nitride stripping process steps, further processing can be performed without concern of the SiGe layer being exposed to a silicide formation process.

18 Claims, 7 Drawing Sheets

METHOD OF FORMING ISOLATION TRENCH WITH SPACER FORMATION

FIELD OF THE INVENTION

The present invention relates to the fabrication of integrated circuit semiconductor devices, and more particularly, to fabricating highly integrated circuit semiconductor devices having high-quality shallow trench isolation (STI) without exposing the portions of the sidewalls of the trench.

BACKGROUND OF THE INVENTION

As miniaturization of elements of integrated circuit semiconductor devices drives the industry, the width and the pitch of an active region have become smaller, thus rendering the use of traditional LOCOS (local oxidation of silicon) isolation techniques problematic. STI is considered a more viable isolation technique than LOCOS because, by its nature, STI creates hardly any bird's beak characteristic of LOCOS, thereby achieving better control of active width at sub-micron feature sizes.

Conventional STI fabrication techniques include forming a pad oxide on an upper surface of a semiconductor substrate, forming a nitride, e.g., silicon nitride, polish stop layer thereon, typically having a thickness of greater than 1,000 Å, forming an opening in the nitride polish stop layer, anisotropically etching to form a trench in the semiconductor substrate, and forming a thermal oxide liner in the trench with insulating material, such as silicon oxide, forming an overburden on the nitride polish stop layer. Planarization is then implemented, as by conducting chemical mechanical polishing (CMP). During subsequent processing, the nitride layer is removed along with the pad oxide followed by formation of active areas, which typically involve masking, ion implantation, and cleaning steps. During such cleaning steps, the top corners of the field oxide are isotropically removed leaving a void or "divot" in the oxide fill.

For example, a conventional STI fabrication technique is illustrated in FIGS. 1 through 4, wherein similar features are denoted by similar reference characters. Adverting to FIG. 1, a pad oxide 11 is formed over an upper surface of a semiconductor substrate 10, and a silicon nitride polish stop layer 12 is formed thereon, typically at a thickness in excess of 1,000 Å. A photomask (not shown) is then used to form an opening through the nitride polish stop layer 12, pad oxide 11, and a trench is formed in the semiconductor substrate 10.

Figure 1:
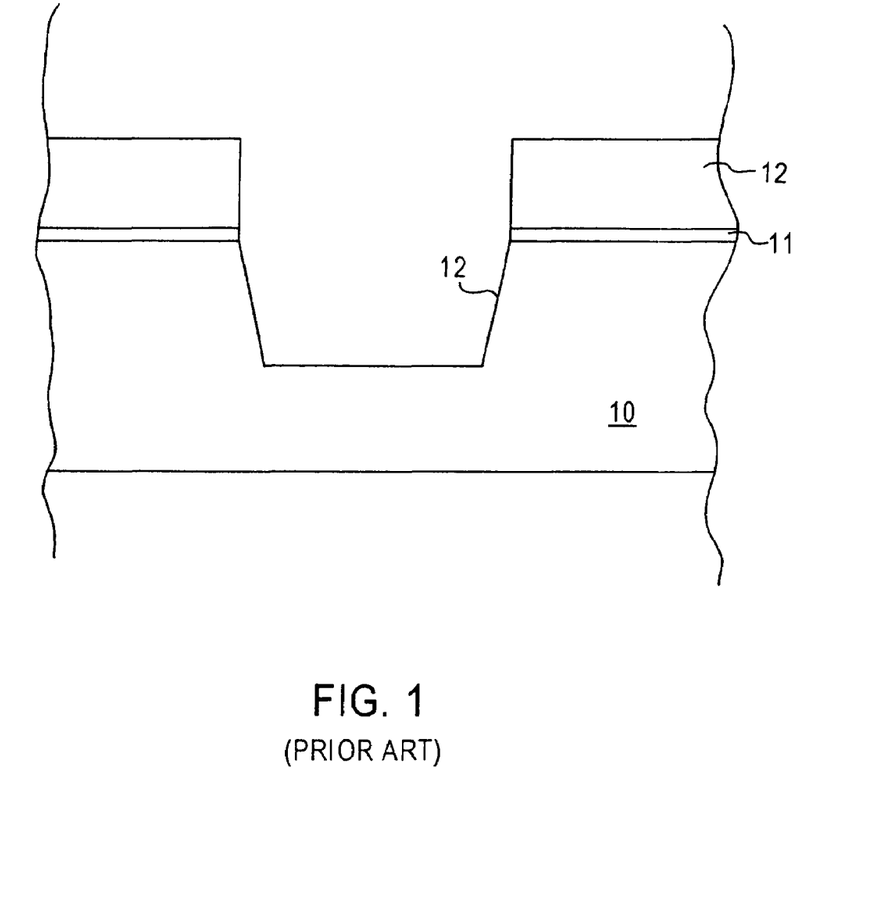
FIGS. 1 through 4 schematically illustrate sequential phases of a conventional method for forming STI regions.
Figure 2:
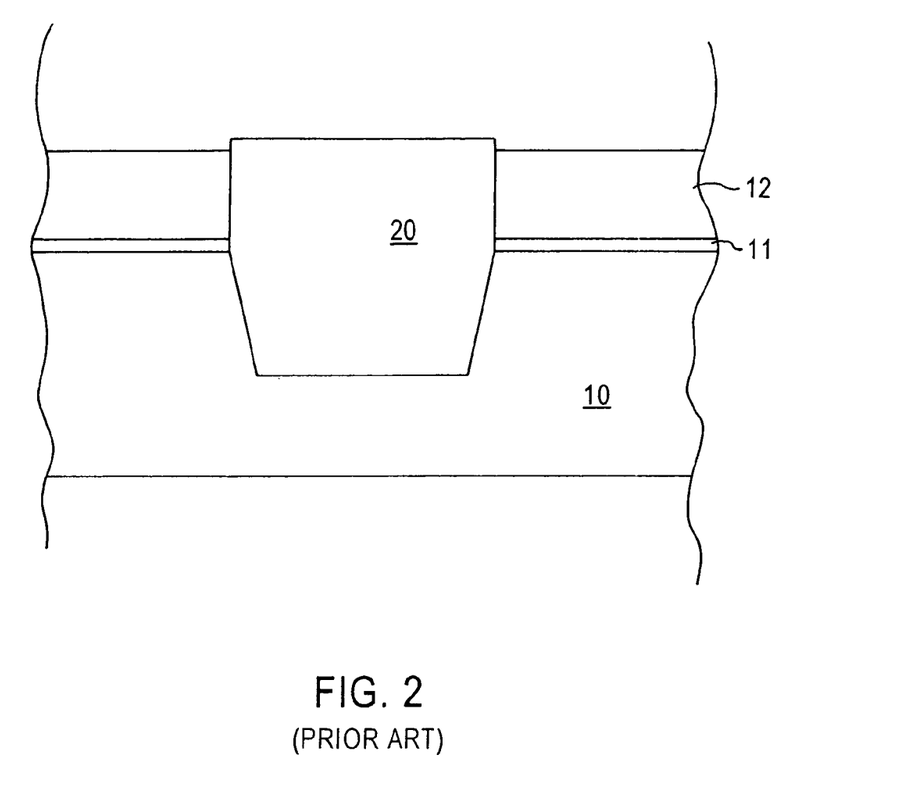
Figure 3:
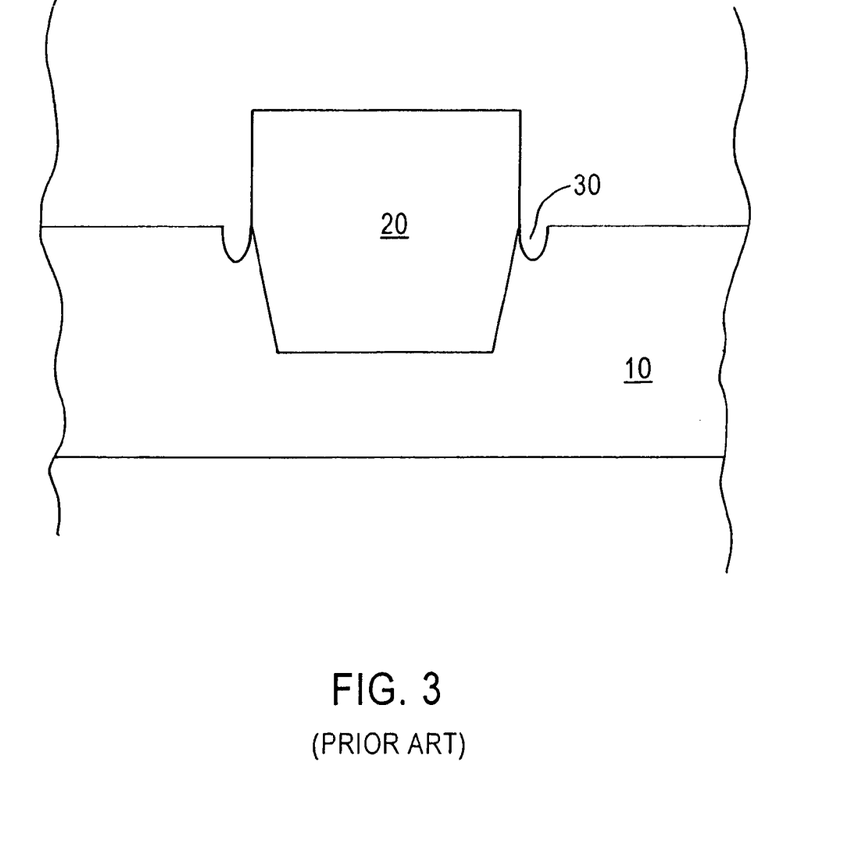

Subsequently, a thermal oxide liner (not shown) is formed in the trench, an insulating material is deposited and planarization implemented, as by CMP, resulting in the intermediate structure illustrated in FIG. 2, the reference character 20 denoting the oxide fill. Similarly, the nitride polish stop layer 12 and pad oxide layer 11 are removed and cleaning steps, which include oxide-consuming HF-based wet steps, are performed on the active regions during the process of doping and gate/sacrificial oxide formation. In current ULSI integration schemes, two and even three different gate oxides are integrated onto a single chip to facilitate different types of transistors. This requires an enhanced oxide etch budget and can exacerbate the divot formation. Such cleaning steps result in the formation of divots 30 as illustrated in FIG. 3.

Figure 4:
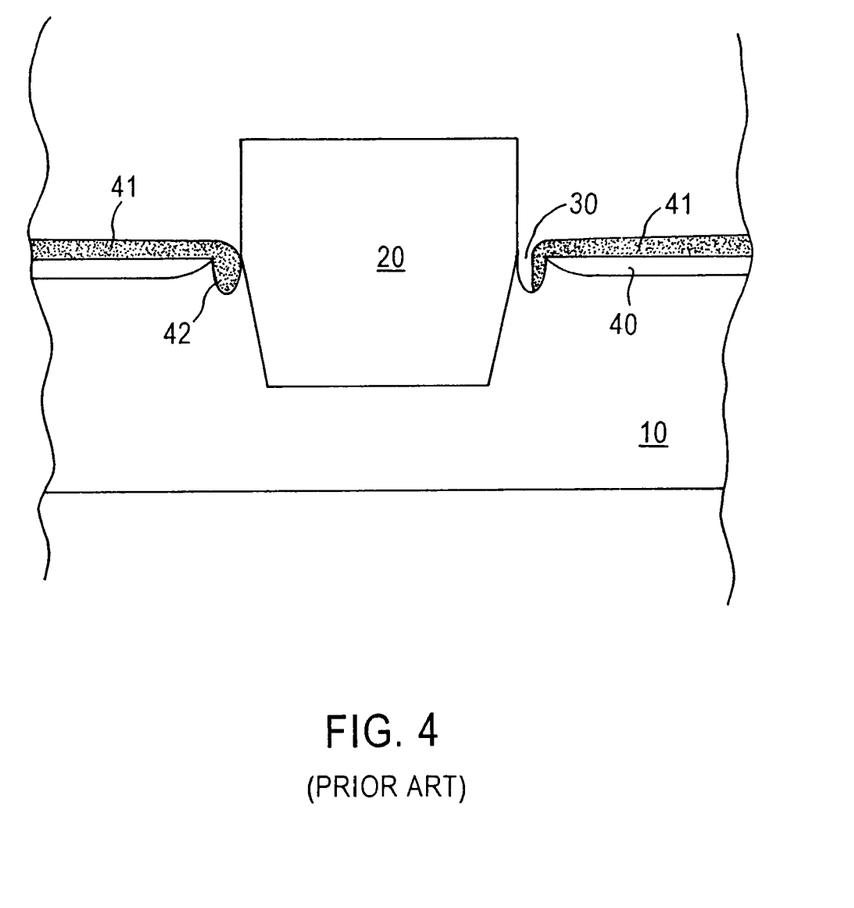

The STI divots are problematic in various respects. For example, STI divots are responsible for high field edge leakage, particularly with shallow source/drain junctions. As shown in FIG. 4, silicide regions 41 formed on shallow source/drain regions 40 grow steeply downwards, as illustrated by reference character 42, below the junction depth formed at a latter stage resulting in high leakage and shorting. Segregation of dopants, notably boron, at STI field edges reduces the junction depth. Accordingly, after the junctions are silicided, the silicide 42 penetrating into the substrate causes shorting routes and, hence, large leakage occurrence from the source/drain junctions to a well or substrate.

In strained silicon applications, in which a thin silicon (Si) layer is provided on a silicon germanium (SiGe) layer, the potential for formation of STI divots during the STI process exposes the underlying SiGe layer during the process flow. This is highly undesirable as it leads to poor silicide formation, among other issues.

SUMMARY OF THE INVENTION

There is a need for a method of protecting an underlying SiGe layer of a strained silicon arrangement in the manufacturing process, such that exposure of the SiGe layer caused by divots in a field oxide region do not allow silicide to form at the SiGe layer. Exposure of the SiGe layer also leads to $GeO_2$ formation at the surface. Unlike $SiO_2$, $GeO_2$ is unstable and can dissolve even in hot water, exposing more of the SiGe to attack. Redisposition and incorporation of Ge-species from solution into electrically conductive areas may also result in undesirable electrical effects.

This and other needs are met by embodiments of the present invention which provide a method of forming an isolation trench comprising the steps of forming a silicon-germanium (SiGe) layer and a silicon (Si) layer on the SiGe layer. A trench is formed extending through the Si layer and into the SiGe layer. Sidewall spacers are formed in the trench, and the trench is filled with isolating material. In certain embodiments of the invention, the formation of the sidewall spacers includes anisotropically etching the spacer layer until at least a portion of the silicon layer within the trench is exposed, but the sidewalls of the trench in the SiGe layer remain completely covered by the sidewall spacers.

With the methodology of the present invention, even if divots are formed at the field oxide by the wet cleans, the SiGe layer is not exposed. This preserves the integrity of the silicide formation, among other advantages.

The earlier stated needs are met by other aspects of the present invention which provide a method of forming shallow trench isolation structures in a strained silicon arrangement, comprising the steps of forming a strained silicon layer on a silicon-germanium layer. A trench is formed in the silicon layer and the silicon germanium layer. The trench is filed with field oxide while preventing exposure of sidewalls of the trench in the silicon germanium layer to the field oxide.

The earlier stated needs are met by still further aspects of the present invention which provide a strained silicon semiconductor arrangement with a shallow trench isolation structure. The arrangement comprises a strained silicon (Si) layer on a silicon germanium (SiGe) layer. A trench extends through the Si layer into the SiGe layer, this trench having sidewalls. Sidewall spacers are provided that cover the entirety of the sidewalls within the trench in the SiGe layer. Field oxide is provided that fills the trench.

The foregoing and other features, aspects and advantages of the present invention will become more apparent from the following detailed description of the invention when taken in conjunction with the accompanying drawings.

BRIEF DESCRIPTION OF THE DRAWINGS

In FIGS. 1 through 4, similar features are denoted by similar reference characters.

In FIGS. 5 through 11, similar features are denoted by similar reference characters.

DETAILED DESCRIPTION OF THE INVENTION

The present invention addresses and solves problems related to the implementation of STI methodology and the SiGe layer in silicon germanium-on-insulator arrangement. The formation of STI divots during the creation of STI structures may expose the SiGe layer in SGOI arrangements. This exposure leads to poor silicide formation, for example, and other deleterious effects. The present invention addresses these problems, in part, by forming sidewall spacers in the trench that extends through the Si layer and into the SiGe layer. The sidewall spacers are recessed and completely cover the sidewalls of the SiGe layer within the trench. Hence, even if an oxide divot is formed by wet cleans, the SiGe layer will not be exposed. This prevents the poor silicide formation and other deleterious effects caused by the oxide divot and exposure of the SiGe layer.

A method in accordance with an embodiment of the present invention is schematically illustrated in FIGS. 5 through 11, wherein similar features are denoted by similar reference characters.

Figure 5:
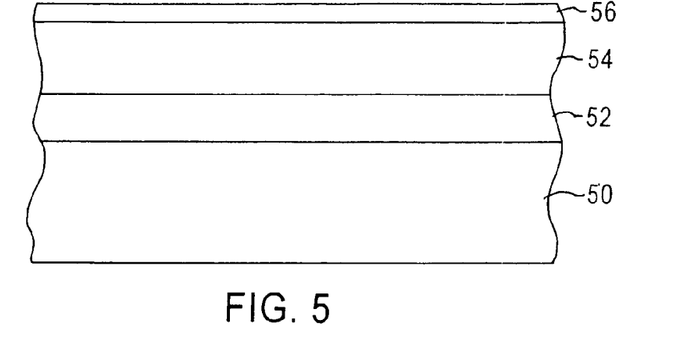
FIGS. 5 through 11 schematically illustrate sequential phases of a method in accordance with an embodiment of the present invention.

Adverting to FIG. 5, a layer of silicon germanium 50 is provided on which a layer of silicon 52 is provided. In a SGOI arrangement, for example, the SiGe layer 50 and the Si layer 52 are provided on an insulator layer (not shown), such as a buried oxide layer. Conventional methodologies for forming the SiGe layer 50 and the Si layer 52 may be employed.

A nitride masking layer 54 and an oxide cap layer 56 are formed on the silicon layer 52. Hence, such layers may be formed by conventional deposition techniques or other methodologies.

Figure 6:
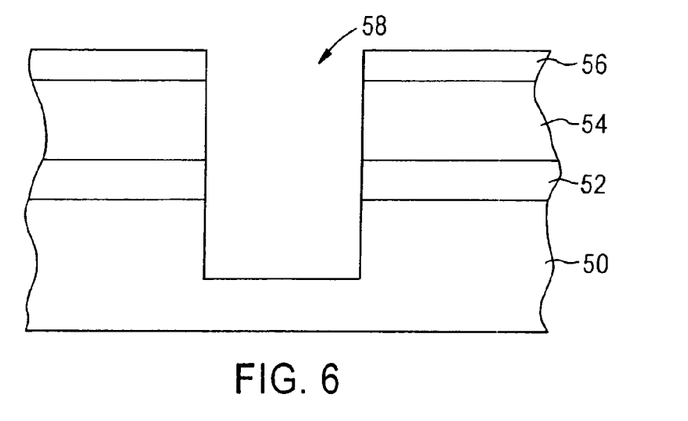

A conventional etch is performed, the results of which are depicted in FIG. 6. The conventional STI etch creates a recess 58 through the oxide cap layer 56, the nitride layer 54, the silicon layer 52 and the silicon germanium layer 50. Recess 58 may extend into the silicon layer 52 and the silicon germanium layer 50 to a conventional depth. A conventional STI etch recipe may be employed to perform the etching.

Figure 7:
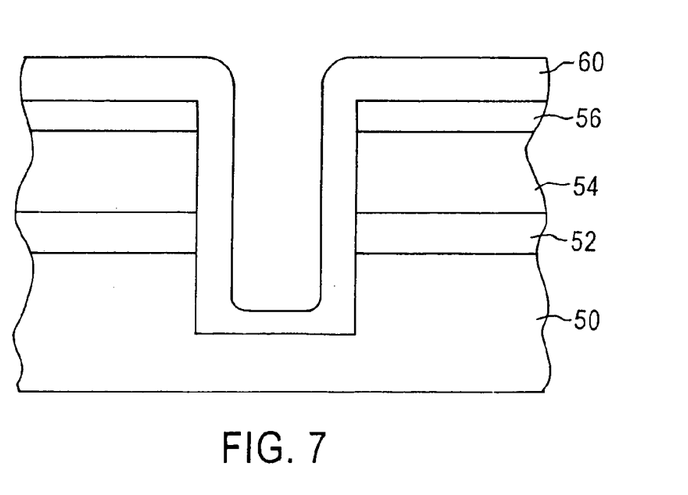
Figure 8:
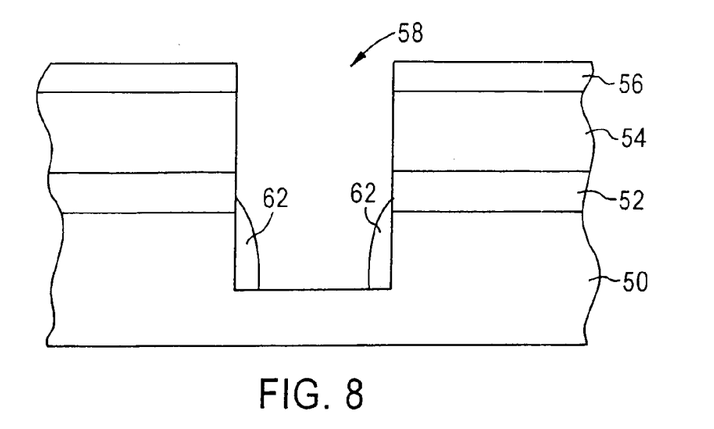

Following the etching of the STI trench 58, a spacer layer 60 is deposited in the trench by conventional deposition techniques. For example, a suitable material to be deposited is silicon nitride. An etch is now performed, the results of which are depicted in FIG. 8. The etch is one that is selective to oxide, for example, so that the oxide cap layer 56 is preserved. The etching may be anisotropic etching, for example, employing $CH_3F+O_2$ or $CH_3F+O_2+Ar$, for example.

In certain embodiments of the invention, the anisotropic etching, such as reactive ion etching, is performed to an extent that forms the sidewall spacer 62 but with an overetch that is enough to recess the spacers 62. In other words, the overetching causes exposure of at least a portion of the sidewalls of the silicon layer 52 within the trench 58. The recess of the spacers is necessary in order to ensure that no part of the spacers 62 is contiguous with the nitride layer 54. Since the nitride layer 54 is typically etched away in a phosphoric acid wet etch bath, any spacer contacting it would be attacked as well, unless it were recessed and thus protected by the oxide filling the trench region. However, the overetching is stopped in good time to assure the coverage of the entire sidewalls of the SiGe layer 50 within the trench 58. The bottom of the trench 58 is exposed by the reactive ion etching.

Figure 9:
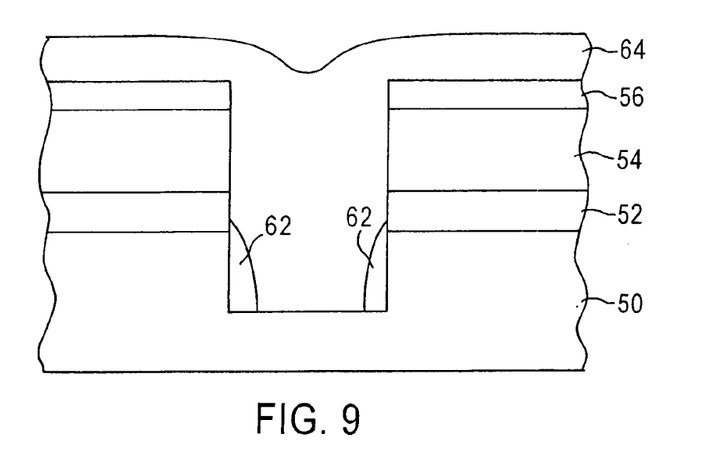
Figure 10:
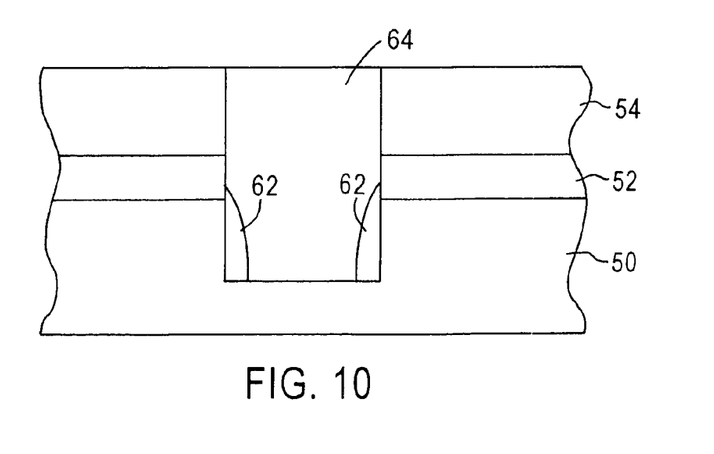
Figure 11:
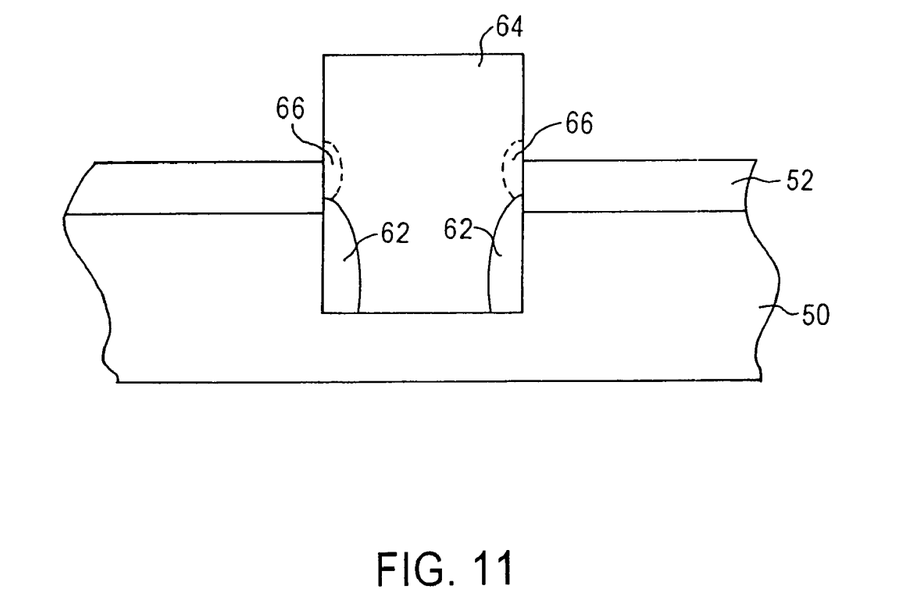

With the sidewall spacer 62 thus formed, the STI process continues in a conventional manner, as depicted in FIGS. 9–11. Hence, FIG. 9 depicts the filling of trench 58 with isolation material, such as field oxide 64.

As depicted in FIG. 10, following the STI fill, a polishing operation is performed that removes the excess STI fill 64 and the oxide layer 56. A conventional polishing technique may be employed.

Following the polishing, a nitride strip is then performed, the results of which are depicted in FIG. 11. The nitride layer 54 is removed during the nitride strip, leaving behind the field oxide 64 of the STI arrangement. In subsequent wet cleans, an oxide divot could potentially be formed, as described earlier with respect to FIGS. 1–4. These potential oxide divots are depicted in phantom in FIG. 11, and provided with reference numeral 66. Hence, even if the oxide divots 66 are formed by the wet cleans, the sidewalls of the SiGe layer 50 will not be exposed as they are securely protected by the sidewall spacers 62. Subsequent processing can now be performed without concern for silicide formation and other deleterious effects caused by SiGe exposure.

The present invention enjoys industrial applicability in fabricating highly integrated semiconductor devices containing STI regions on SGOI arrangements or other arrangements, with improved silicide formation. The present invention enjoys particular applicability in manufacturing semiconductor devices with sub-micron dimensions.

Although the present invention has been described and illustrated in detail, it is to be clearly understood that the same is by way of illustration and example only and is not to be taken by way of limitation, the scope of the present invention being limited only by the terms of the appended claims.

What is claimed is:

1. A method of forming an isolation trench, comprising:
   forming a silicon-germanium (SiGe) layer;
   forming a silicon (Si) layer on the SiGe layer;
   etching a trench extending through the Si layer and into but not through the SiGe layer;
   forming sidewall spacers in the trench that fully cover the SiGe layer and which only partially cover the Si layer within the trench by depositing and etching insulating material within the trench; and
   filling the trench with isolating material.

2. The method of claim 1, wherein the step of depositing insulating material includes depositing a spacer layer in the trench.

3. The method of claim 2, further including anisotropically etching the spacer layer.

4. The method of claim 3, wherein the step of anisotropically etching includes overetching the sidewall spacers until at least a portion of the Si layer within the trench is exposed.

5. The method of claim 4, wherein the space layer is a nitride.

6. The method of claim 5, further comprising forming a nitride layer on the silicon layer and a capping layer on the nitride layer, prior to forming the trench, wherein the step of forming the trench also includes forming the trench through the capping layer and the nitride layer extending into the Si layer and the SiGe layer.

7. The method of claim 6, further comprising removing the capping layer and the nitride layer after the trench is filled with the isolating material.

8. The method of claim 7, further comprising forming silicide with the Si layer after the step of removing the capping layer and the nitride layer.

9. A method of forming shallow trench isolation structures in a strained silicon arrangement, comprising the steps of:
 forming a strained silicon (Si) layer on a silicon-germanium (SiGe) layer;
 etching a trench extending through the strained Si layer and into but not through the SiGe layer;
 depositing insulating material directly on the SiGe and the Si within the trench;
 etching the insulating material to fully cover the SiGe and partially cover the Si within the trench; and
 filling the trench with field oxide with the insulating material preventing exposure of sidewalls of the trench in the SiGe layer to the field oxide.

10. The method of claim 9, wherein the insulating material is a nitride.

11. The method of claim 10, wherein the insulating material forms a nitride layer within the trench.

12. The method of claim 11, wherein the step of etching the insulating material includes anisotropically etching the nitride layer to form sidewall spacers on the sidewalls of the trench of the SiGe.

13. The method of claim 12, wherein the step of anisotropically etching further includes overetching the nitride layer to expose sidewalls of the trench in the strained Si layer.

14. The method of claim 13, further comprising forming a silicide on the strained Si layer.

15. A method of forming shallow trench isolation structures in a strained silicon arrangement, comprising the steps of:
 forming a trench through a strained silicon (Si) layer and into but not through a silicon-germanium (SiGe) layer;
 depositing nitride directly on the Si layer and the SiGe layer within the trench;
 etching the nitride to partially expose the Si layer within the trench while fully covering the SiGe layer; and
 filling the trench with field oxide.

16. The method of claim 15, wherein the nitride is etched anisotropically.

17. The method of claim 16, wherein the etching is an overetching that partially exposes the Si layer within the trench.

18. The method of claim 17, further comprising forming silicide with the Si layer.

* * * * *